US012640752B2

(12) United States Patent
Huang

(10) Patent No.: US 12,640,752 B2
(45) Date of Patent: May 26, 2026

(54) MULTIPLYING DIGITAL-TO-ANALOG CONVERTER

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 96 days.

(21) Appl. No.: 18/940,923

(22) Filed: Nov. 8, 2024

(65) Prior Publication Data

US 2025/0158633 A1     May 15, 2025

(30) Foreign Application Priority Data

Nov. 15, 2023   (TW) .................................. 112144151

(51) Int. Cl.
| | |
|---|---|
| *H03M 1/74* | (2006.01) |
| *H03M 1/00* | (2006.01) |
| *H03M 1/12* | (2006.01) |
| *H03M 1/16* | (2006.01) |
| *H03M 1/72* | (2006.01) |

(52) U.S. Cl.
CPC ................ *H03M 1/74* (2013.01); *H03M 1/00* (2013.01); *H03M 1/12* (2013.01); *H03M 1/16* (2013.01); *H03M 1/72* (2013.01)

(58) Field of Classification Search
CPC ........... H03M 1/74; H03M 1/12; H03M 1/72; H03M 1/16; H03M 1/00
See application file for complete search history.

(56) References Cited

U.S. PATENT DOCUMENTS

| | | |
|---|---|---|
| 7,924,206 B2 | 4/2011 | Sano |
| 9,755,582 B2 | 9/2017 | Lin et al. |
| 2007/0090984 A1 | 4/2007 | Lu et al. |

(Continued)

FOREIGN PATENT DOCUMENTS

EP          1917719 B1     5/2008

OTHER PUBLICATIONS

T. Musah and U.-K. Moon, Correlated level shifting technique with cross-coupled gain-enhancement capacitors, Electronics Letters Jun. 18, 2009 vol. 45 No. 13.

(Continued)

*Primary Examiner* — Joseph J Lauture
(74) *Attorney, Agent, or Firm* — WPAT, PC

(57)          ABSTRACT

A multiplying digital-to-analog converter (MDAC) includes an analog-to-digital converter (ADC), a selection circuit, an operational amplifier, a first switched capacitor (SC) circuit, a second SC circuit, a first switch, a second switch, a first load capacitor, and a second load capacitor. The ADC generates a selection signal according to a first input signal and a second input signal. The selection circuit generates a first reference voltage and a second reference voltage according to the selection signal. The first and second SC circuits amplify the signal component of the first and second input signals. The first switch receives the second reference voltage. The second switch receives the first reference voltage. The first load capacitor receives the second reference voltage through the first switch. The second load capacitor receives the first reference voltage through the second switch.

13 Claims, 7 Drawing Sheets

(56) References Cited

U.S. PATENT DOCUMENTS

| 2012/0162000 A1* | 6/2012 | Gotoh | .................... | H03M 1/06 |
| | | | | 341/172 |
| 2024/0283456 A1 | 8/2024 | Huang | | |

OTHER PUBLICATIONS

B. Robert Gregoire and Un-Ku Moon, An Over-60 dB True Rail-to-Rail Performance Using Correlated Level Shifting and an Opamp With Only 30 dB Loop Gain, IEEE Journal of Solid-State Circuits, vol. 43, No. 12, Dec. 2008.

* cited by examiner

|     | Config. 1 | Config. 2 | Config. 3 |
| --- | --- | --- | --- |
| VR1 | Vcm | Vy | Vx |
| VR2 | Vcm | Vx | Vy |

FIG. 5

| capacitor | Config. 1 | Config. 2 | Config. 3 | Config. 4 | Config. 5 | Config. 6 | Config. 7 |
|---|---|---|---|---|---|---|---|
| C1a | Vcm | Vy | Vx | Vx | Vx | Vy | Vy |
| C2a | Vcm | Vy | Vx | Vx | Vcm | Vy | Vcm |
| C3a | Vcm | Vy | Vx | Vcm | Vcm | Vcm | Vcm |
| C1b | Vcm | Vx | Vy | Vy | Vy | Vx | Vx |
| C2b | Vcm | Vx | Vy | Vy | Vcm | Vx | Vcm |
| C3b | Vcm | Vx | Vy | Vcm | Vcm | Vcm | Vcm |

FIG. 7A

| reference voltage | Config. 1 | Config. 2 | Config. 3 | Config. 4 | Config. 5 | Config. 6 | Config. 7 |
|---|---|---|---|---|---|---|---|
| VR1 | Vcm | 2Vx | 2Vy | Vy | Vcm | Vx | Vx |
| VR2 | Vcm | 2Vy | 2Vx | Vx | Vcm | Vy | Vy |
| VR3 | Vcm | Vx | Vy | Vy | Vy | Vx | Vcm |
| VR4 | Vcm | Vy | Vx | Vx | Vx | Vy | Vcm |

FIG. 7B

MULTIPLYING DIGITAL-TO-ANALOG CONVERTER

BACKGROUND OF THE INVENTION

1. Field of the Invention

The present invention generally relates to a multiplying digital-to-analog converter (MDAC) of a pipeline analog-to-digital converter (pipeline ADC, also known as pipelined ADC).

2. Description of Related Art

Reference is made to FIG. 1, which is the circuit diagram of a multiplying digital-to-analog converter (MDAC). The MDAC 100 is a 1.5-bit MDAC, which has an input terminal Vinp, an input terminal Vinn, an output terminal Vp2, and an output terminal Vn2. The MDAC 100 includes an analog-to-digital converter (ADC) 110, a selection circuit 120, a sampling and amplifying circuit 130$p$, a sampling and amplifying circuit 130$n$, and an operational amplifier 140.

When the MDAC 100 is applied to a pipeline ADC (also known as pipelined ADC), the ADC 110 is the sub-ADC of the pipeline ADC. The ADC 110 is coupled to the input terminals Vinp and Vinn and configured to generate the selection signal SEL according to the input signals Vsp and Vsn. The input signal Vsp (=Vdc+dV) and the input signal Vsn (=Vdc−dV) may be a differential signal pair, where Vdc is the common-mode voltage of the two, and dV is the signal component.

The selection circuit 120 is coupled to the ADC 110 and configured to determine the reference voltages VR1 and VR2 according to the selection signal SEL from multiple preset voltages (including, but not limited to, the preset voltage Vx, the preset voltage Vy, and the common-mode voltage Vcm of the preset voltages Vx and Vy) and to provide the reference voltages VR1 and VR2 to the sampling and amplifying circuits 130$p$ and 130$n$, respectively. The preset voltage Vx may be Vcm+Vz, and the preset voltage Vy may be Vcm−Vz, where Vz is a direct current (DC) voltage.

The sampling and amplifying circuits 130$p$ and 130$n$ each include two capacitors (including the capacitor C1$a$ or the capacitor C1$b$) and six switches. The sampling and amplifying circuit 130$p$ (sampling and amplifying circuit 130$n$) samples the input signal Vsp (input signal Vsn) in the sampling phase and amplifies the signal component dV of the input signal Vsp (input signal Vsn) in the amplifying phase according to the reference voltage VR1 (reference voltage VR2) and the reference voltage Vref. As the operational details of the MDAC 100 are well known to people having ordinary skill in the art, further elaboration is omitted for brevity here.

Reference is made to FIG. 2, which is the circuit diagram of the conventional MDAC. The MDAC 200 is a 2.5-bit MDAC, which includes an ADC 210, a selection circuit 220, a sampling and amplifying circuit 230$p$, a sampling and amplifying circuit 230$n$, and an operational amplifier 240.

The sampling and amplifying circuit 230$p$ includes four capacitors (including a capacitor C1$a$, a capacitor C2$a$, and a capacitor C3$a$) and ten switches. The sampling and amplifying circuit 230$n$ is the differential counterpart of the sampling and amplifying circuit 230$p$ and also includes four capacitors and ten switches (not shown). In the amplification phase, the capacitors C1$a$, C2$a$, and C3$a$ each receive one of the preset voltage Vx, the preset voltage Vy, and the common-mode voltage Vcm. As the operational details of the MDAC 200 are well known to people having ordinary skill in the art, further elaboration is omitted for brevity here.

Because the feedback factor of the MDACs 100 and 200 is not large enough (0.5 and 0.25, respectively), the area and power consumption of the operational amplifiers 140 and 240 are quite considerable, resulting in the circuit being uncompetitive.

Furthermore, due to the typically large capacitance value of the capacitors in the sampling and amplifying circuits 130$p$, 130$n$, 230$p$, and 230$n$, these capacitors are not easily driven by the reference voltage VR1, the reference voltage VR2, the preset voltage Vx, the preset voltage Vy, or the common-mode voltage Vcm. However, if the driving capability of the reference voltages VR1 and VR2 is enhanced to drive these capacitors, the overall power consumption of the MDAC 100 and the MDAC 200 will increase.

SUMMARY OF THE INVENTION

In view of the issues of the prior art, an object of the present invention is to provide a multiplying digital-to-analog converter (MDAC), so as to make an improvement to the prior art.

According to one aspect of the present invention, an MDAC is provided. The MDAC has a first input terminal, a second input terminal, a first output terminal, and a second output terminal. The first input terminal and the second input terminal respectively receive a first input signal and a second input signal. The first input signal is a common-mode voltage minus a signal component, and the second input signal is the common-mode voltage plus the signal component. The MDAC includes an analog-to-digital converter (ADC), a selection circuit, an operational amplifier, a first switched capacitor (SC) circuit, a second SC circuit, a first switch, a second switch, a first load capacitor, and a second load capacitor. The ADC is configured to generate a selection signal according to the first input signal and the second input signal. The selection circuit is coupled to the ADC and configured to generate a first reference voltage and a second reference voltage according to the selection signal. The operational amplifier has an input port and an output port. The first SC circuit is coupled to the first input terminal, the second input terminal, the input port, and the output port and configured to amplify the signal component. The second SC circuit is coupled to the first input terminal, the second input terminal, the input port, and the output port and configured to amplify the signal component. The first switch is coupled to the first output terminal and receives the second reference voltage. The second switch is coupled to the second output terminal and receives the first reference voltage. The first load capacitor is coupled to the output port and receives the second reference voltage through the first switch. The second load capacitor is coupled to the output port and receives the first reference voltage through the second switch.

The technical means embodied in the embodiments of the present invention can solve at least one of the problems of the prior art. Therefore, compared to the prior art, the present invention can effectively reduce the circuit area and power consumption.

These and other objectives of the present invention no doubt become obvious to those of ordinary skill in the art after reading the following detailed description of the preferred embodiments with reference to the various figures and drawings.

BRIEF DESCRIPTION OF THE DRAWINGS

FIG. 5 is a schematic diagram of the configuration of the reference voltages.

FIG. 7A and FIG. 7B are the schematic diagrams of the configuration of the reference voltages.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes multiplying digital-to-analog converters (MDACs). On account of that some or all elements of the MDAC could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

In the following description, signals are active-high, which means that signals are active at high levels and inactive at low levels, and that asserting/de-asserting a signal means setting the signal high/low. This is for the purpose of explanation, not for limiting the scope of the invention. In other words, in an alternative implementation, signals can be active-low, which means that signals are active at low levels and inactive at high levels, and that asserting/de-asserting a signal means setting the signal low/high. A level transition or a logic level transition means that a signal changes from an asserted (active) state to a de-asserted (inactive) state, or from a de-asserted (inactive) state to an asserted (active) state.

Figure 3:
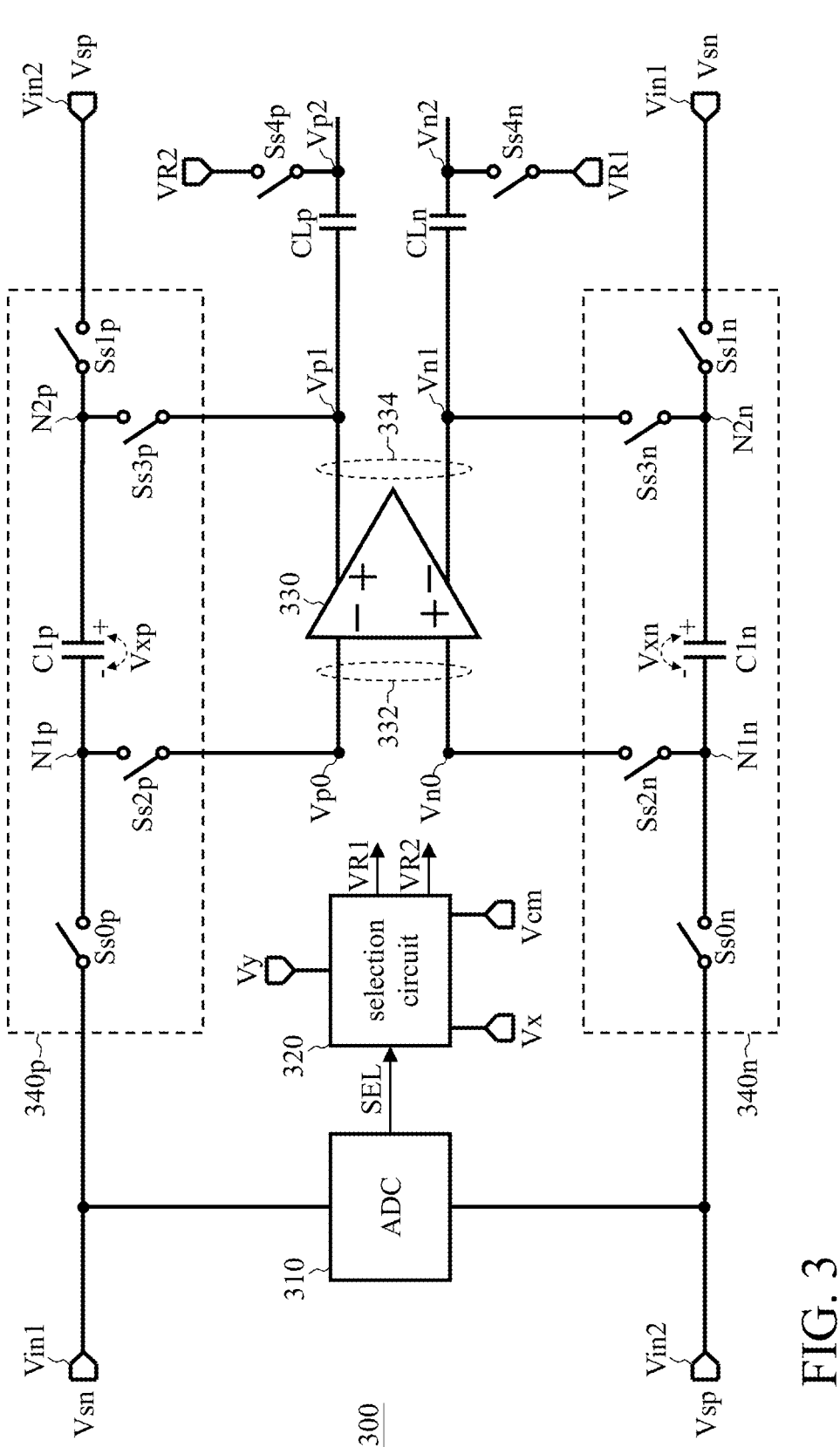
FIG. 3 is the circuit diagram of an MDAC according to an embodiment of the present invention.

Reference is made to FIG. 3, which is a circuit diagram of an MDAC according to an embodiment of the present invention. The MDAC 300 has an input terminal Vin1 and an input terminal Vin2 and includes an analog-to-digital converter (ADC) 310, a selection circuit 320, an operational amplifier 330, a load capacitor CLp, a load capacitor CLn, a switched capacitor (SC) circuit 340*p*, an SC circuit 340*n*, a switch Ss4*p*, and a switch Ss4*n*. The SC circuit 340*p* is coupled or electrically connected to the input terminals Vin1 and Vin2 and includes a capacitor C1*p*, a switch Ss0*p*, a switch Ss1*p*, a switch Ss2*p*, and a switch Ss3*p*. The SC circuit 340*n* is coupled or electrically connected to the input terminals Vin1 and Vin2 and includes a capacitor C1*n*, a switch Ss0*n*, a switch Ss1*n*, a switch Ss2*n*, and a switch Ss3*n*.

The input terminals Vin1 and Vin2 receive the input signals Vsn and Vsp, respectively. The input signal Vsp (=Vdc+dV) and the input signal Vsn (=Vdc-dV) may be a differential signal pair, where Vdc is the common-mode voltage of the two, and dV is the signal component. The SC circuits 340*p* and 340*n* are used to amplify the signal component dV.

The two terminals of the capacitor C1*p* (capacitor C1*n*) are a node N1*p* (node N1*n*) and a node N2*p* (node N2*n*), respectively.

The operational amplifier 330 has an input port 332 and an output port 334. The input port 332 includes an input node Vp0 and an input node Vn0, which are respectively the inverting input terminal and the non-inverting input terminal of the operational amplifier 330. The output port 334 includes an output node Vp1 and an output node Vn1, which are respectively the non-inverting output terminal and the inverting output terminal of the operational amplifier 330. The signal (e.g., voltage) at the output node Vp1 (output node Vn1) is coupled or outputted to the output terminal Vp2 (output terminal Vn2) through the load capacitor CLp (load capacitor CLn). In some embodiments, the output terminals Vp2 and Vn2 can be the input terminals of a next stage circuit.

The SC circuit 340*p* is further coupled or electrically connected to the input port 332 (more specifically, the input node Vp0) and the output port 334 (more specifically, the output node Vp1). The SC circuit 340*n* is further coupled or electrically connected to the input port 332 (more specifically, the input node Vn0) and the output port 334 (more specifically, the output node Vn1).

The two terminals of the load capacitor CLp (load capacitor CLn) are the output port 334 (more specifically, the output node Vp1 (output node Vn1)) and the output terminal Vp2 (output terminal Vn2), respectively.

One terminal of the switch Ss0*p* (switch Ss0*n*) is coupled or electrically connected to the input terminal Vin1 (input terminal Vin2) (i.e., receiving the input signal Vsn (input signal Vsp)); the other terminal of the switch Ss0*p* (switch Ss0*n*) is coupled or electrically connected to the node N1*p* (node N1*n*).

One terminal of the switch Ss1*p* (switch Ss1*n*) is coupled or electrically connected to the input terminal Vin2 (input terminal Vin1); the other terminal of the switch Ss1*p* (switch Ss1*n*) is coupled or electrically connected to the node N2*p* (node N2*n*).

One terminal of the switch Ss2*p* (switch Ss2*n*) is coupled or electrically connected to the node N1*p* (node N1*n*); the other terminal of the switch Ss2*p* (switch Ss2*n*) is coupled or electrically connected to the input port 332 (more specifically, the input node Vp0 (input node Vn0)).

One terminal of the switch Ss3*p* (switch Ss3*n*) is coupled or electrically connected to the node N2*p* (node N2*n*); the other terminal of the switch Ss3*p* (switch Ss3*n*) is coupled or electrically connected to the output port 334 (more specifically, the output node Vp1 (output node Vn1)).

One terminal of the switch Ss4*p* (switch Ss4*n*) is coupled or electrically connected to the output terminal Vp2 (output terminal Vn2); the other terminal of the switch Ss4*p* (switch Ss4*n*) receives the reference voltage VR2 (reference voltage VR1) (i.e., coupled or electrically connected to the selection circuit 320).

When the MDAC 300 is applied to a pipeline analog-to-digital converter (pipeline ADC, also known as pipelined ADC), the ADC 310 is the sub-ADC of the pipeline ADC. The ADC 310 is coupled or electrically connected to the input terminals Vin1 and Vin2 and generates the selection signal SEL according to the input signals Vsp and Vsn.

The selection circuit 320 is coupled or electrically connected to the ADC 310. The functions of the ADC 310 and the selection circuit 320 are similar or substantially identical to those of the ADC 110 and the selection circuit 120, and therefore further elaboration is omitted for brevity here.

Figure 4:
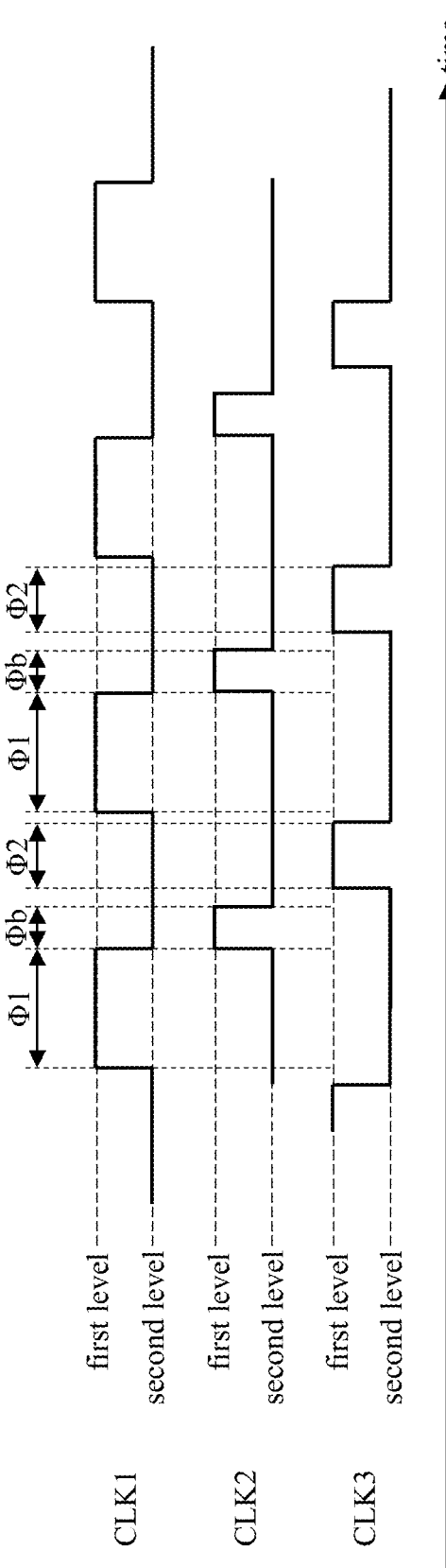
FIG. 4 shows the waveform of the clocks of the present invention.

Reference is made to FIG. 4, which shows the waveform of the clocks of the present invention. The clocks CLK1, CLK2, and CLK3 are not at the first level (e.g., high level) at the same time.

When the clock CLK1 is at the first level (second level), the switches Ss0*p*, Ss0*n*, Ss1*p*, and Ss1*n* are turned on (turned off). When the clock CLK3 is at the first level (second level), the switches Ss2*p*, Ss2*n*, Ss3*p*, Ss3*n*, Ss4*p*, and Ss4*n* are turned on (turned off).

During the phase Φ1 (i.e., when the clock CLK1 is at the first level and the clocks CLK2 and CLK3 are at the second level (e.g., low level)), the switches Ss0*p*, Ss0*n*, Ss1*p*, and Ss1*n* are turned on, and the switches Ss2*p*, Ss2*n*, Ss3*p*, Ss3*n*, Ss4*p*, and Ss4*n* are turned off, so that the capacitors C1*p* and C1*n* sample the input signals Vsn and Vsp. When the phase Φ1 ends, the voltage Vxp across the capacitor C1*p* and the voltage Vxn across the capacitor C1*n* are 2 dV and −2 dV, respectively (in other words, |Vxp|=|Vxn|=2 dV).

During the phase Φb (i.e., when the clock CLK2 is at the first level, and the clocks CLK1 and CLK3 are at the second level), the ADC 310 generates the selection signal SEL, and the selection circuit 320 generates the reference voltages VR1 and VR2 according to the selection signal SEL.

During the phase Φ2 (i.e., when the clock CLK3 is at the first level, and the clocks CLK1 and CLK2 are at the second level), the switches Ss0*p*, Ss0*n*, Ss1*p*, and Ss1*n* are turned off, and the switches Ss2*p*, Ss2*n*, Ss3*p*, Ss3*n*, Ss4*p*, and Ss4*n* are turned on, so that the voltage Vxp across the capacitor C1*p* and the voltage Vxn across the capacitor C1*n* are applied to the output port 334 of the operational amplifier 330 (more specifically, the output node Vp1 and the output node Vn1), and the reference voltages VR2 and VR1 are applied to the output terminals Vp2 and Vn2, respectively.

It should be noted that the length of the phase Φ1 can be equal to or not equal to the length of the phase Φ2.

As is known from the above discussion to people having ordinary skill in the art, the effect achieved by the MDAC 300 is equivalent to the effect achieved by the MDAC 100, so the MDAC 300 is also a 1.5-bit MDAC. Because the feedback factor (1) of the MDAC 300 is twice the feedback factor (0.5) of the MDAC 100, the area and power consumption of the operational amplifier 330 can be effectively reduced. This advantage can greatly enhance the competitiveness of the MDAC 300.

Figure 1:
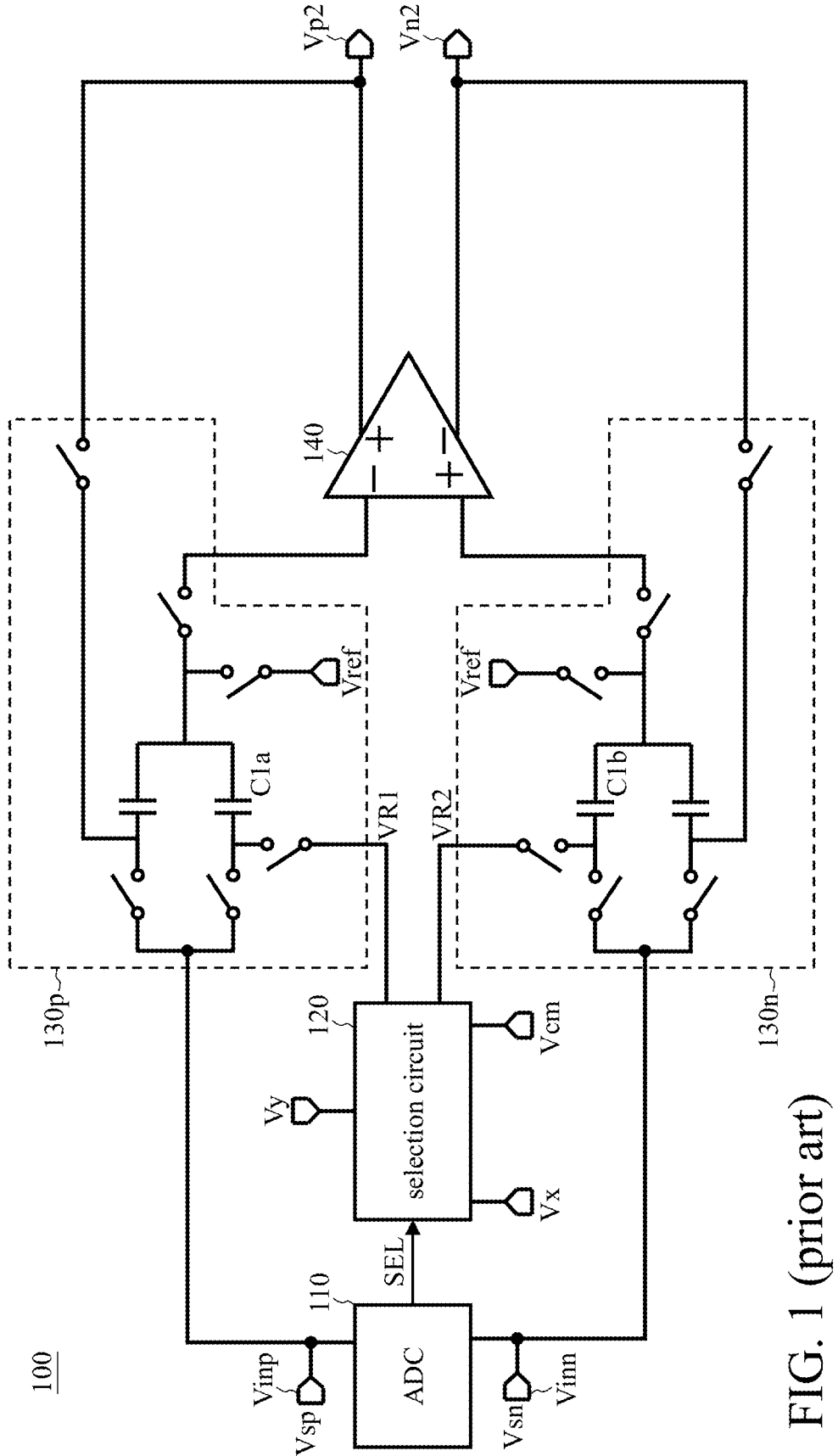
FIG. 1 is the circuit diagram of a conventional multiplying digital-to-analog converter (MDAC).

In addition, please refer to both FIG. 1 and FIG. 3. The MDAC 100 uses four capacitors to sample the input signals Vsn and Vsp, while the MDAC 300 uses only two capacitors (the capacitors C1*p* and C1*n*) to sample the input signals Vsn and Vsp. That is to say, the MDAC of the present invention uses fewer sampling capacitors, which can reduce the circuit area and/or cost.

Reference is made to FIG. 5, which is a schematic diagram of the configurations of the reference voltages VR1 and VR2. The configuration of the reference voltages VR1 and VR2 of the MDAC 300 is the same as that of the MDAC 100. However, it should be noted that in the MDAC 100, the reference voltages VR1 and VR2 are applied to the inverting input terminal and the non-inverting input terminal of the operational amplifier 140, respectively, while in the MDAC 300, the reference voltages VR1 and VR2 are applied to the inverting output terminal and the non-inverting output terminal of the operational amplifier 330, respectively.

Figure 6:
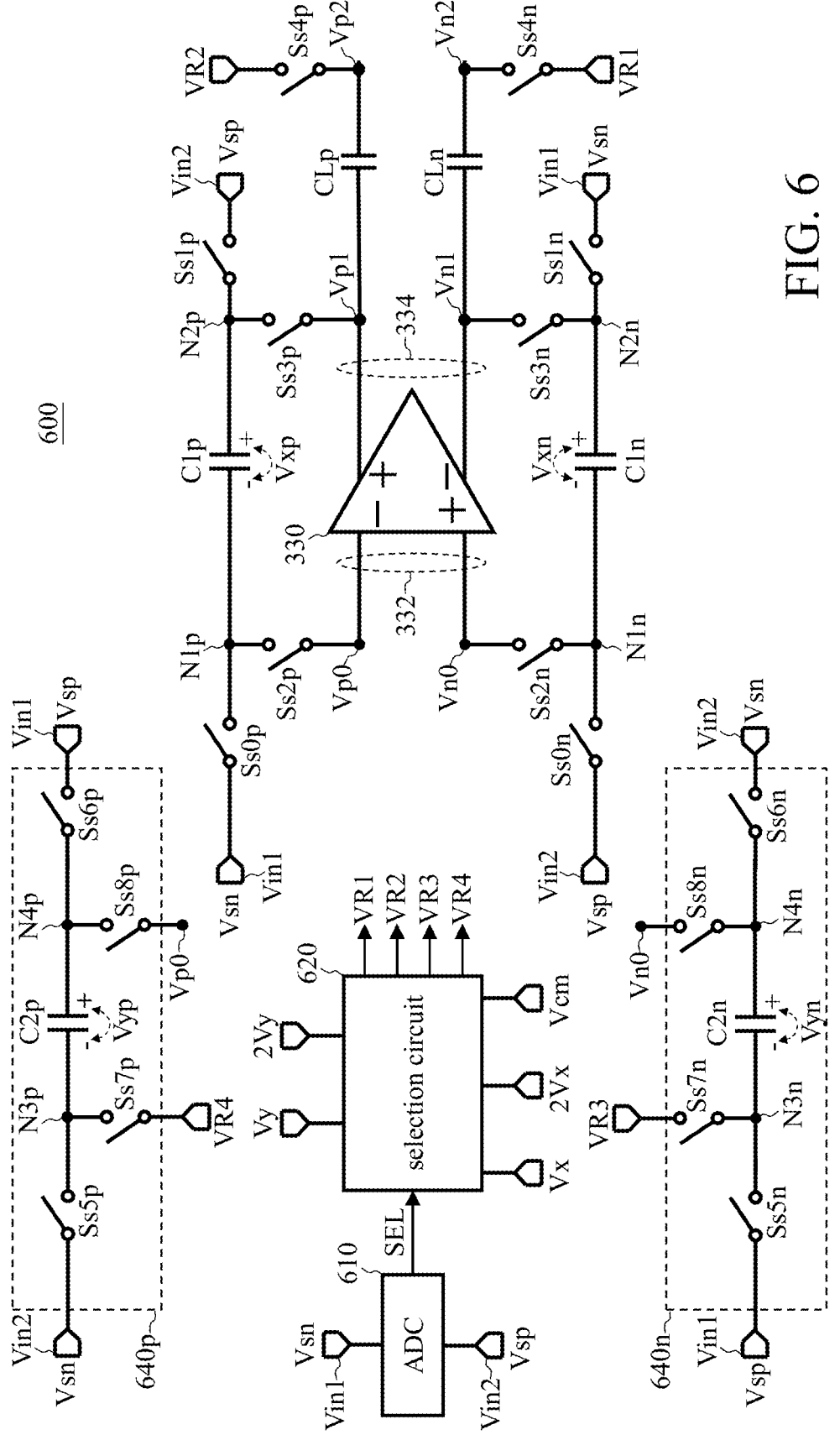
FIG. 6 is the circuit diagram of an MDAC according to another embodiment of the present invention.

Reference is made to FIG. 6, which is the circuit diagram of an MDAC according to another embodiment of the present invention. The MDAC 600 is a 2.5-bit MDAC. In comparison with the MDAC 300, the MDAC 600 further includes an SC circuit 640*p* and an SC circuit 640*n*, and the ADC 310 and the selection circuit 320 are replaced by the ADC 610 and the selection circuit 620, respectively.

Figure 2:
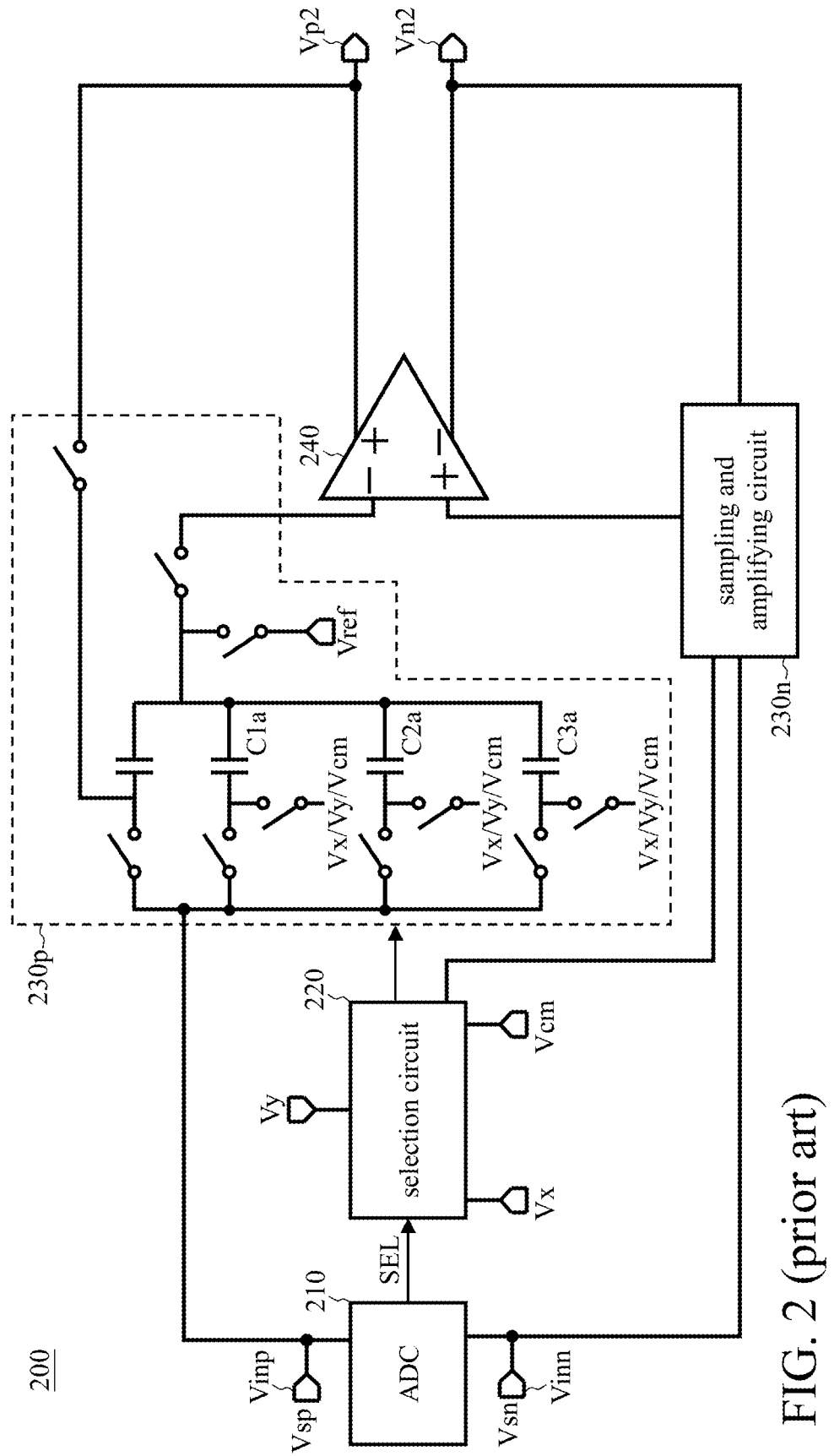
FIG. 2 is the circuit diagram of a conventional MDAC.

The function of the ADC 610 is similar to that of the ADC 210 from FIG. 2, so further elaboration is omitted for brevity here. The selection circuit 620 is coupled or electrically connected to the ADC 610, determines the reference voltages VR1, VR2, VR3, and VR4 according to the selection signal SEL from multiple preset voltages (including, but not limited to, the preset voltage Vx, the preset voltage Vy, the common-mode voltage Vcm, 2 times Vx (2 Vx), and 2 times Vy (2 Vy)), and provides the reference voltages VR1, VR2, VR3, and VR4 to the load capacitor CLn, the load capacitor CLp, the capacitor C2*n*, and the capacitor C2*p*, respectively. The design of the selection circuit 620 will be detailed below with reference to FIG. 7A and FIG. 7B.

The SC circuit 640*p* (SC circuit 640*n*) includes the capacitor C2*p* (capacitor C2*n*), the switch Ss5*p* (switch Ss5*n*), the switch Ss6*p* (switch Ss6*n*), the switch Ss7*p* (switch Ss7*n*), and the switch Ss8*p* (switch Ss8*n*).

The two terminals of the capacitor C2*p* (capacitor C2*n*) are a node N3*p* (node N3*n*) and a node N4*p* (node N4*n*), respectively.

One terminal of the switch Ss5*p* (switch Ss5*n*) is coupled or electrically connected to the input terminal Vin2 (input terminal Vin1); the other terminal of the switch Ss5*p* (switch Ss5*n*) is coupled or electrically connected to the node N3*p* (node N3*n*).

One terminal of the switch Ss6*p* (switch Ss6*n*) is coupled or electrically connected to the input terminal Vin1 (input terminal Vin2); the other terminal of the switch Ss6*p* (switch Ss6*n*) is coupled or electrically connected to the node N4*p* (node N4*n*).

One terminal of the switch Ss7*p* (switch Ss7*n*) is coupled or electrically connected to the node N3*p* (node N3*n*); the other terminal of the switch Ss7*p* (switch Ss7*n*) receives the reference voltage VR4 (reference voltage VR3) (i.e., coupled or electrically connected to the selection circuit 620).

One terminal of the switch Ss8*p* (switch Ss8*n*) is coupled or electrically connected to the node N4*p* (node N4*n*); the other terminal of the switch Ss8*p* (switch Ss8*n*) is coupled or electrically connected to the input port 332 (more specifically, the input node Vp0 (input node Vn0)).

Reference is made to both FIG. 4 and FIG. 6. When the clock CLK1 is at the first level (second level), the switches Ss5*p*, Ss5*n*, Ss6*p*, and Ss6*n* are turned on (turned off). When the clock CLK3 is at the first level (second level), the switches Ss7*p*, Ss7*n*, Ss8*p*, and Ss8*n* are turned on (turned off).

During the phase Φ1, the switches Ss5*p*, Ss5*n*, Ss6*p*, and Ss6*n* are turned on, and the switches Ss7*p*, Ss7*n*, Ss8*p*, and Ss8*n* are turned off, so that the capacitors C2*p* and C2*n* sample the input signals Vsp and Vsn. Similarly, when the phase Φ1 ends, the absolute value of the voltage Vyp across the capacitor C2*p* and the absolute value of the voltage Vyn across the capacitor C2*n* are both 2 dV (in other words, |Vyp|=|Vyn|=2 dV).

During the phase Φb, the ADC 610 generates the selection signal SEL, and the selection circuit 620 generates the reference voltages VR1, VR2, VR3, and VR4 according to the selection signal SEL.

During the phase Φ2, the switches Ss5*p*, Ss5*n*, Ss6*p*, and Ss6*n* are turned off, while the switches Ss7*p*, Ss7*n*, Ss8*p*, and Ss8*n* are turned on. This configuration connects the capacitors C1$p$ and C2$p$ in series, as well as the capacitors C1$n$ and C2$n$ in series. Consequently, the voltages across the capacitors C1$p$ and C2$p$ (each 2 dV, totaling 4 dV) and the voltages across the capacitors C1$n$ and C2$n$ (each –2 dV, totaling –4 dV) are applied to the output port 334 of the operational amplifier 330 (more specifically, to the output nodes Vp1 and Vn1).

Reference is made to FIG. 7A and FIG. 7B. FIG. 7A shows the configurations of the reference voltages in the MDAC 200 from FIG. 2 (it should be noted that the capacitors C1$b$, C2$b$, and C3$b$ are included in the sampling and amplifying circuit 230$n$). FIG. 7B shows the configurations of the reference voltages in the MDAC 600 from FIG. 6. The configurations 1 to 7 in FIG. 7A correspond to the configurations 1 to 7 in FIG. 7B, respectively. Therefore, people having ordinary skill in the art can design the selection circuit 620 according to FIG. 7A and FIG. 7B. For example, in reference to configuration 4, the capacitors C1$a$ to C3$a$ and the capacitors C1$b$ to C3$b$ in FIG. 2 receive the voltages Vx, Vx, Vcm, Vy, Vy, and Vcm, respectively; if the reference voltages VR1 to VR4 in FIG. 6 are set to Vy, Vx, Vy, and Vx, respectively, then the MDAC 600 in FIG. 6 is equivalent to the MDAC 200.

As is known from the above discussion to people having ordinary skill in the art, the effect achieved by the MDAC 600 is equivalent to the effect achieved by the MDAC 200. Because the feedback factor (0.5) of the MDAC 600 is twice the feedback factor (0.25) of the MDAC 200, the area and power consumption of the operational amplifier 330 can be effectively reduced. This advantage can greatly enhance the competitiveness of the MDAC 600.

In addition, please refer to both FIG. 2 and FIG. 6. The MDAC 200 uses eight capacitors to sample the input signals Vsn and Vsp (four capacitors in the sampling and amplifying circuit 230$p$, and the other four in the sampling and amplifying circuit 230$n$), while the MDAC 600 uses only four capacitors (capacitors C1$p$, C1$n$, C2$p$, and C2$n$) to sample the input signals Vsn and Vsp. That is to say, the MDAC of the present invention uses fewer sampling capacitors, which can reduce the circuit area and/or cost.

The 1.5-bit MDAC and the 2.5-bit MDAC are intended to illustrate the invention by way of example and not to limit the scope of the claimed invention. People having ordinary skill in the art may apply the present invention to MDACs of more bits (where the number of preset voltages increases accordingly) in accordance with the foregoing discussions.

Note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A multiplying digital-to-analog converter (MDAC) having a first input terminal, a second input terminal, a first output terminal, and a second output terminal, the first input terminal and the second input terminal respectively receiving a first input signal and a second input signal, the first input signal being a common-mode voltage minus a signal component, the second input signal being the common-mode voltage plus the signal component, the MDAC comprising:

an analog-to-digital converter (ADC) configured to generate a selection signal according to the first input signal and the second input signal;

a selection circuit coupled to the ADC and configured to generate a first reference voltage and a second reference voltage according to the selection signal;

an operational amplifier having an input port and an output port;

a first switched capacitor (SC) circuit coupled to the first input terminal, the second input terminal, the input port, and the output port and configured to amplify the signal component;

a second SC circuit coupled to the first input terminal, the second input terminal, the input port, and the output port and configured to amplify the signal component;

a first switch coupled to the first output terminal and receiving the second reference voltage;

a second switch coupled to the second output terminal and receiving the first reference voltage;

a first load capacitor coupled to the output port and receiving the second reference voltage through the first switch; and a second load capacitor coupled to the output port and receiving the first reference voltage through the second switch.

2. The MDAC of claim 1, wherein the first SC circuit comprises a first capacitor, a third switch, a fourth switch, a fifth switch, and a sixth switch, the second SC circuit comprises a second capacitor, a seventh switch, an eighth switch, a ninth switch, and a tenth switch, the first capacitor has a first terminal and a second terminal, the second capacitor has a third terminal and a fourth terminal, the third switch is coupled between the first input terminal and the first terminal, the fourth switch is coupled between the second terminal and the second input terminal, the fifth switch is coupled between the first terminal and the input port, the sixth switch is coupled between the second terminal and the output port, the seventh switch is coupled between the second input terminal and the third terminal, the eighth switch is coupled between the fourth terminal and the first input terminal, the ninth switch is coupled between the third terminal and the input port, and the tenth switch is coupled between the fourth terminal and the output port.

3. The MDAC of claim 2, wherein the MDAC operates according to a first clock, a second clock, and a third clock; when the first clock is at a first level and the second clock and the third clock are at a second level, the third switch, the seventh switch, the fourth switch, and the eighth switch are turned on, and the fifth switch, the ninth switch, the sixth switch, the tenth switch, the first switch, and the second switch are turned off; when the third clock is at the first level and the first clock and the second clock are at the second level, the third switch, the seventh switch, the fourth switch, and the eighth switch are turned off, and the fifth switch, the ninth switch, the sixth switch, the tenth switch, the first switch, and the second switch are turned on.

4. The MDAC of claim 2, wherein the input port comprises an inverting input terminal and a non-inverting input terminal, the output port comprises a non-inverting output terminal and an inverting output terminal, the first load capacitor is coupled between the non-inverting output terminal and the first output terminal, the second load capacitor is coupled between the inverting output terminal and the second output terminal, the fifth switch is coupled between the first terminal and the inverting input terminal, the ninth switch is coupled between the third terminal and the non-inverting input terminal, the sixth switch is coupled between the second terminal and the non-inverting output terminal, and the tenth switch is coupled between the fourth terminal and the inverting output terminal.

5. The MDAC of claim 2, wherein the first capacitor and the second capacitor are configured to sample the first input signal and the second input signal; after sampling is finished, an absolute value of a first voltage across the first capacitor is twice the signal component, and an absolute value of a second voltage across the second capacitor is twice the signal component.

6. The MDAC of claim 5 further comprising:

a third SC circuit comprising a third capacitor, wherein the third capacitor is coupled between the first input terminal and the second input terminal and configured to sample the first input signal and the second input signal; and a fourth SC circuit comprising a fourth capacitor, wherein the fourth capacitor is coupled between the first input terminal and the second input terminal and configured to sample the first input signal and the second input signal.

7. The MDAC of claim 6, wherein after sampling is finished, an absolute value of a third voltage across the third capacitor is twice the signal component, and an absolute value of a fourth voltage across the fourth capacitor is twice the signal component.

8. The MDAC of claim 2, wherein the selection circuit further generates a third reference voltage and a fourth reference voltage according to the selection signal, the MDAC further comprising:

a third capacitor having a fifth terminal and a sixth terminal;

a fourth capacitor having a seventh terminal and an eighth terminal;

an eleventh switch coupled between the second input terminal and the fifth terminal;

a twelfth switch coupled between the first input terminal and the seventh terminal;

a thirteenth switch coupled between the first input terminal and the sixth terminal;

a fourteenth switch coupled between the second input terminal and the eighth terminal;

a fifteenth switch coupled to the fifth terminal and receiving the fourth reference voltage;

a sixteenth switch coupled to the seventh terminal and receiving the third reference voltage;

a seventeenth switch coupled between the sixth terminal and the input port; and an eighteenth switch coupled between the eighth terminal and the input port.

9. The MDAC of claim 8, wherein the MDAC operates according to a first clock, a second clock, and a third clock, when the first clock is at a first level and the second clock and the third clock are at a second level, the third switch, the seventh switch, the fourth switch, the eighth switch, the eleventh switch, the twelfth switch, the thirteenth switch, and the fourteenth switch are turned on, and the fifth switch, the ninth switch, the sixth switch, the tenth switch, the first switch, the second switch, the fifteenth switch, the sixteenth switch, the seventeenth switch, and the eighteenth switch are turned off; when the third clock is at the first level and the first clock and the second clock are at the second level, the third switch, the seventh switch, the fourth switch, the eighth switch, the eleventh switch, the twelfth switch, the thirteenth switch, and the fourteenth switch are turned off, and the fifth switch, the ninth switch, the sixth switch, the tenth switch, the first switch, the second switch, the fifteenth switch, the sixteenth switch, the seventeenth switch, and the eighteenth switch are turned on.

10. The MDAC of claim 8, wherein the first capacitor, the second capacitor, the third capacitor, and the fourth capacitor are configured to sample the first input signal and the second input signal, the first capacitor, the second capacitor, the third capacitor, and the fourth capacitor respectively have a first across voltage, a second across voltage, a third across voltage, and a fourth across voltage after sampling is finished, and absolute values of the first across voltage, the second across voltage, the third across voltage, and the fourth across voltage are twice the signal component.

11. The MDAC of claim 8, wherein the input port comprises an inverting input terminal and a non-inverting input terminal, the output port comprises a non-inverting output terminal and an inverting output terminal, the first load capacitor is coupled between the non-inverting output terminal and the first output terminal, the second load capacitor is coupled between the inverting output terminal and the second output terminal, the fifth switch is coupled between the first terminal and the inverting input terminal, the ninth switch is coupled between the third terminal and the non-inverting input terminal, the sixth switch is coupled between the second terminal and the non-inverting output terminal, the tenth switch is coupled between the fourth terminal and the inverting output terminal, the seventeenth switch is coupled between the sixth terminal and the inverting input terminal, and the eighteenth switch is coupled between the eighth terminal and the non-inverting input terminal.

12. The MDAC of claim 8, wherein the MDAC is a 2.5-bit MDAC, and the MDAC samples the first input signal and the second input signal using only the first capacitor, the second capacitor, the third capacitor, and the fourth capacitor.

13. The MDAC of claim 2, wherein the MDAC is a 1.5-bit MDAC, and the MDAC samples the first input signal and the second input signal using only the first capacitor and the second capacitor.

* * * * *